United States Patent
Brambilla et al.

(10) Patent No.: US 6,549,044 B2
(45) Date of Patent: Apr. 15, 2003

(54) DRIVING CIRCUIT FOR A VOICE COIL MOTOR AND DRIVING METHOD THEREOF

(75) Inventors: Massimiliano Brambilla, Sesto San Giovanni (IT); Maurizio Nessi, Como (IT); Ezio Galbiati, Agnadello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/972,750

(22) Filed: Oct. 5, 2001

(65) Prior Publication Data
US 2002/0047734 A1 Apr. 25, 2002

(30) Foreign Application Priority Data
Oct. 9, 2000 (IT) .......................... MI00A2176

(51) Int. Cl.[7] .............................. G11B 21/02; H03B 1/00
(52) U.S. Cl. ......................... 327/110; 360/75; 318/432
(58) Field of Search ................................. 327/108–110; 330/252, 253, 260, 276, 291, 85; 318/432–433, 678; 360/67, 75, 264.3, 264.7

(56) References Cited

U.S. PATENT DOCUMENTS

| | | | | |
|---|---|---|---|---|
| 4,538,099 A | * | 8/1985 | Moon | 318/592 |
| 5,245,296 A | * | 9/1993 | Miller et al. | 330/102 |
| 6,150,853 A | * | 11/2000 | Chrappan et al. | 372/108 |
| 6,229,273 B1 | * | 5/2001 | Kelly et al. | 318/138 |
| 6,373,650 B1 | * | 4/2002 | Pedrazzini | 318/432 |

* cited by examiner

Primary Examiner—My-Trang Nu Ton
(74) Attorney, Agent, or Firm—Hogan & Hartson L.L.P.

(57) ABSTRACT

A control circuit providing a driving current to a voice coil motor to position a reading and writing head of a disk memory system is described. The circuit comprises a first and a second class AB amplifiers the outputs of which are connected to the terminals of a first resistor in series with the voice coil motor so that a current passes through the voice coil motor and through the first resistor. The circuit comprises a sense amplifier the input terminals of which are coupled with the terminals of said first resistor, a device at the input of which is present a signal which is a sum of an external signal and of an output signal of the sense amplifier. The first amplifier and the second amplifier being driven in inverted phase by an output signal produced by the device. The circuit comprises means for inserting a second resistor in series with the first resistor so that said current passes through the series of said first and said second resistors and so that said sense amplifier has the input terminals coupled with the terminals of said series of resistors.

10 Claims, 2 Drawing Sheets

DRIVING CIRCUIT FOR A VOICE COIL MOTOR AND DRIVING METHOD THEREOF

BACKGROUND OF THE INVENTION

1. Field of the Invention

The present invention refers to a driving circuit for a voice coil motor and driving method thereof.

2. Background of the Invention

In the state of the art electronic circuits utilized to move reading and writing heads in disk memory system of the type used in computer systems and similar are known. In such circuits a coil is widely used as an actuator to move and position the reading and writing heads; such a coil actuator is typically called a "voice coil motor" or even simpler "voice coil" due to its similarity to the coils commonly used in audio speakers and the like. The voice coils are operated in a way similar to the acoustic coils of the audio speakers. In fact, a positive current applied to the coil produces a movement of the reading and writing head in one direction, while a negative current produces a movement of the head in the opposite direction.

The voice coils are operated in two different operational modes. The first mode is the so-called seek mode (seek) wherein large currents are applied to the coil to rapidly bring the reading and writing head to the point or track of the disk where the desired information which must be read or written is located.

The second mode is the track-follow mode (track-follow) wherein small currents are applied to the coil to maintain the position of the reading and writing head in the desired track or point.

The systems used have to be linear so that the acceleration of the reading and writing head is directly proportional to the value of the current applied to the coil. Therefore, because of the high degree of linearity required and because of the large currents required for the seek mode, the amplifiers employed in the voice coil systems operate as class AB amplifiers.

A circuit scheme of a known voice coil system is shown in FIG. 1. A voice coil motor indicated by a coil L1, which belongs to a driving mechanism of a reading and writing head of a computer hard disk, is supplied by a current delivered by two class AB power amplifiers A10 and A20, the first one of which is in non-inverting configuration and the second one is in inverting configuration. The current I1 which passes through the coil L1 is directly proportional to the input voltage Vin coming from a digital-analog converter D. The magnetic field generated by the coil L1 allows the reading and writing head to move. A resistor Rs is placed in series to the coil L1 to the terminals of which the inputs of a sense operational amplifier O1 the output voltage signal of which is added with the signal Vin at the inverting input of a error differential operational amplifier ErI are connected. The non inverting input of the operational amplifier ErI is connected to a reference voltage Vref while the output is connected to the input of the power amplifiers A10 and A20; the outputs of the amplifiers A10 and A20 are driven in inverted phase by the output voltage signal Outl of the amplifier ErI. The presence of the amplifier O1 and the error amplifier ErI assure a certain precision in the work state of the reading and writing head.

SUMMARY OF THE INVENTION

In view of the state of the art described, it is an object of the present invention to provide a driving circuit for a voice coil motor which assures a higher precision in the control of the current passing through it and also a higher precision in the placement of the reading and writing head above all in track-follow mode.

According to present invention, such object is obtained by means of a control circuit providing a driving current to a voice coil motor to position a reading and writing head of a disk memory system, said circuit comprising a first and a second class AB amplifier, the outputs of which are connected to the terminals of a first resistor in series with said voice coil motor so that a current passes through said voice coil motor and through said first resistor, said circuit comprising a sense amplifier the input terminals of which are coupled with the terminals of said first resistor, a device at the input of which a signal is present which is a sum of an external signal and of an output signal of the sense amplifier, said first amplifier and said second amplifier being driven in inverted phase by an output signal produced by said device, characterized by comprising means for inserting a second resistor in series with the first resistor so that said current passes through the series of said first and said second resistors and so that said sense amplifier has the input terminals coupled with the terminals of said series of resistors.

According to present invention it is possible to provide a driving method of a voice coil motor.

The features and the advantages of the present invention will be made evident by the following detailed description of an embodiment thereof, shown as not limiting example in the annexed drawings.

BRIEF DESCRIPTION OF THE DRAWING FIGS.

DETAILED DESCRIPTION OF THE INVENTION

Figure 1:
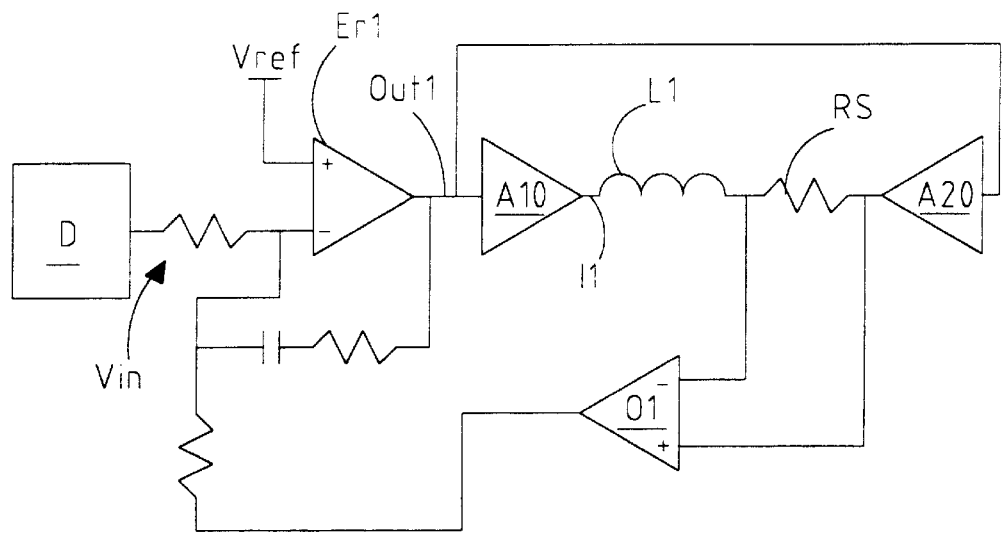
FIG. 1 is a circuit scheme of a driving circuit of a voice coil motor according to the prior art.
Figure 2:
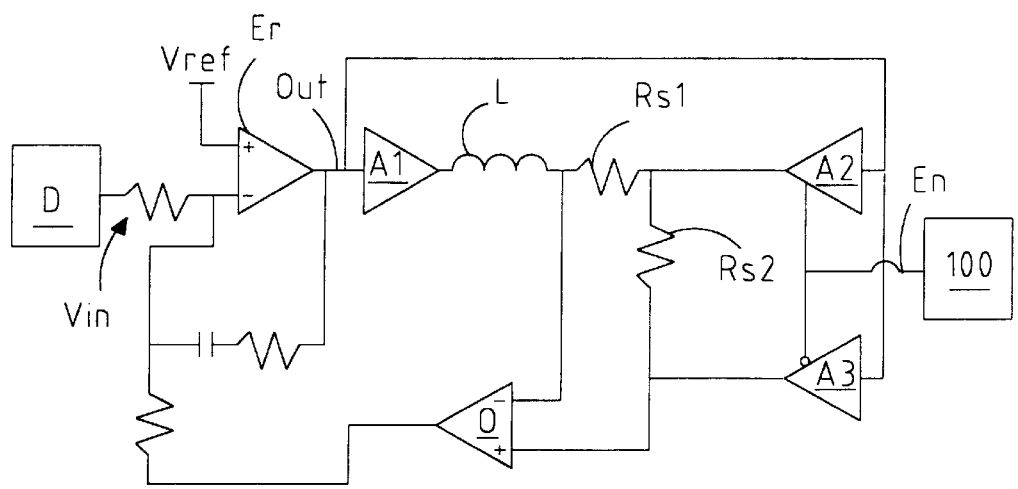
FIG. 2 is a circuit scheme of a driving circuit of a voice coil motor according to the present invention.

In FIG. 2 a circuit scheme of a driving circuit of a voice coil motor according to the present invention is shown. A voice coil motor indicated by a coil L, which belongs to a driving mechanism of a reading and writing head of a computer hard disk, is supplied by a current delivered by class AB power amplifiers, more specifically by an amplifier A1 together to an amplifier A2 or to an amplifier A3 because the amplifiers A2 and A3 are alternatively selectionable by means of a enable signal En coming from a operating device 100. The amplifier A1 is in a non-inverting configuration while the amplifiers A2 and A3 are together in an inverting configuration. The current I passing through the coil L is directly proportional to the input voltage Vin coming from a digital-analog converter D. The magnetic field generated by the coil L where the current I passes through allows the movement of the reading and writing head. A resistor Rs1 or the sum of the resistors Rs1 and Rs2 is placed in series to the coil L, as retaining the path of the current I, respectively when the enable signal En is at a high logic level so as to activate the amplifier A2 or when the enable signal En is at a low logic signal so as to activate the amplifier A3. The input terminals of a sense operational amplifier O, the output voltage signal of which is added with the signal Vin coming from the digital-analog converter D at the inverting input of an error differential operational amplifier Er, are connected to the terminals of the resistors Rs1 and Rs2. The non-inverting input of the error differential operational amplifier Er is connected to a reference voltage Vref while the output thereof is connected to the inputs of the three amplifiers A1, A2 and A3; in such way the output of the amplifier A1 and the outputs of the amplifiers A2 and A3 are driven in inverted phase by the output voltage signal Out of the amplifier Er. The amplifiers A1, A2 and A3 are supplied between a supply voltage Vcc and ground, therefore they work at a voltage equal to Vcc/2.

The driving circuit of FIG. 2 must activate the voice coil motor in two different operation modes: the seek mode wherein a high current I is applied to the coil L to rapidly bring the reading and writing head on the disk point or track where the desired information which must be read or written is located, and the track-follow mode wherein a small current I is applied to the coil L to maintain the position of the reading and writing head on the desired point or track. Typically the ratio between the current I used in the seek mode and the same current I utilized in the track-follow mode is in the order of 10 or 20 to 1.

In the seek mode the device 100 brings the signal En at the high logic level so as to activate the amplifier A2 and to inactivate the amplifier A3 and therefore the current I passing through the coil L will pass through the resistor Rs1 for obtaining an input voltage of the operational amplifier 0 which is equal to I*Rs1.

In the track-follow mode, because a high precision degree in the placement of the head for accurately reading and writing data is required, the device 100 brings the signal En at the high logic level so as to activate the amplifier A3 and so as to inactivate the amplifier A2. The current passes through the two resistors Rs1 and Rs2 and therefore the input voltage of the operational amplifier is equal to (Rs1+Rs2)*I; this is higher than the previous case. In such case a higher output voltage of the operational amplifier 0 is obtained. This is a higher feedback voltage which as increasing the signal/noise ratio allows a higher feedback action and also a higher precision for maintaining-the reading and writing head on track.

Figure 3:
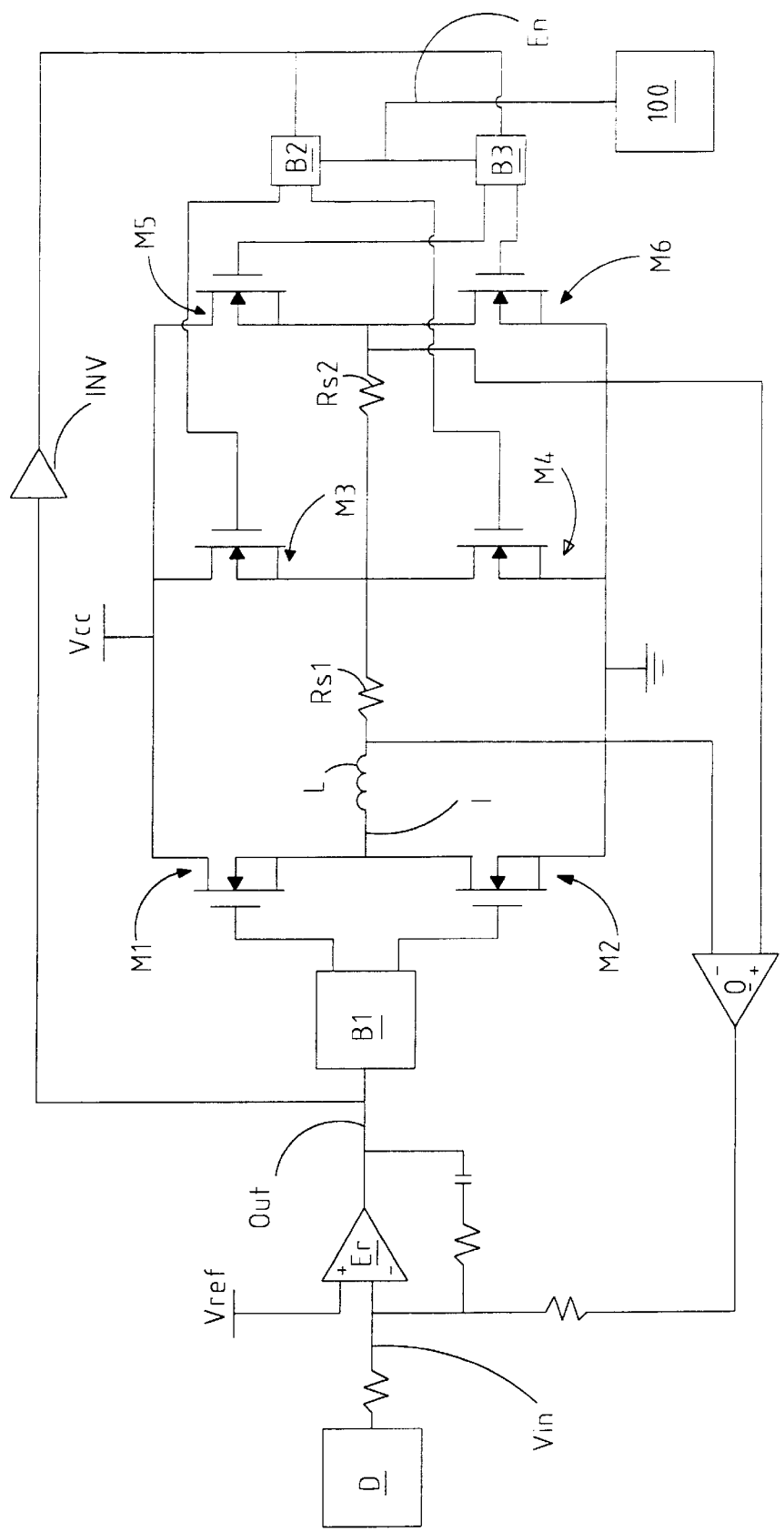
FIG. 3 is a more detailed circuit scheme than the scheme of FIG. 2.

In FIG. 3 a circuit scheme as possible implementation of the scheme in FIG. 2 is described. The class AB power amplifiers A1, A2 and A3 are constituted by couples of transistors which are placed according to an H-bridge, more precisely the amplifier A1 is formed by the couple of NMOS transistors M1–M2 and the amplifier A2 is formed by the couple of NMOS transistors M3–M4 and the amplifier A3 is formed by the couple of NMOS transistors M5–M6. The NMOS transistor couples M1–M2, M3–M4, M5–M6 are preceded by respective uncouple pre-driver circuits B1, B2 and B3 the outputs of which are connected to the gate terminals of the aforementioned transistor couples. The NMOS transistor couples M3–M4 and M5–M6 are alternatively selectionable by means of the enable signal En coming from the device 100 acting on the pre-driver circuits B2 and B3, more precisely if the signal En is at the high logic level it activates the pre-driver circuit B2, while if the same signal is at the low logic level it activates the pre-driver circuit B3. The NMOS transistor couple M1–M2 and the NMOS transistor couples M3–M4 and M5–M6 are operated in inverted phase because the predriver circuit B1 is directly connected with the output of the error amplifier Er and the pre-driver circuits B2 and B3 are connected with the output of an inverter INV the input of which is connected in turn to the output of the amplifier Er. The NMOS transistor couples M1–M2, M3–M4, M5–M6 are supplied between a supply voltage Vcc and ground and they work at a voltage of about Vcc/2.

What is claimed is:

1. A control circuit providing a driving current to a voice coil motor to position a reading and writing head of a disk memory system, said circuit comprising a first and a second class AB amplifiers the outputs of which are connected to the terminals of a first resistor in series with said voice coil motor so that a current passes through said voice coil motor and through said first resistor, said circuit comprising a sense amplifier the input terminals of which are coupled with the terminals of said first resistor, a device at the input of which is a signal present which is a sum of an external signal and of an output signal of the sense amplifier, said first amplifier and said second amplifier being driven in inverted phase by an output signal produced by said device, comprising means for inserting a second resistor in series with the first resistor so that said current passes through the series of said first and said second resistors when said circuit operates in a track-follow mode and so that said sense amplifier has the input terminals coupled with the terminals of said series of resistors.

2. The circuit according to claim 1, wherein said means comprise a third class AB amplifier and an operating device, said third amplifier being driven as said second amplifier by said output signal of said device and the output terminal of which is connected to said second resistor and said third amplifier being selectable alternatively with respect to said second amplifier by means of said operating device.

3. The circuit according to claim 2, wherein said operating device sends an enable signal that enables said second amplifier and disables said third amplifier or vice versa respectively when said enable signal is at a high logic level or is at a low logic level.

4. The circuit according to claim 2, wherein said first, said second and said third class AB amplifiers comprise power amplifiers.

5. The circuit according to claim 2, wherein each of said first, said second and said third amplifiers comprises a couple of transistors driven in parallel and connected in series with respect to the supply voltage.

6. The circuit according to claim 2, wherein each of said first, said second and said third amplifiers comprises a couple of MOS transistors.

7. The circuit according to claim 2, further comprising pre-driver circuits placed before each of said first, said second and said third amplifiers.

8. The circuit according to claim 1, wherein said device comprises an error differential operational amplifier.

9. The circuit according to claim 1, wherein said sense amplifier comprises a differential operational amplifier.

10. The circuit according to claim 1, wherein said external signal derives from a digital-analog converter.

* * * * *